(12) United States Patent
Nieminen

(10) Patent No.: US 7,165,210 B2
(45) Date of Patent: Jan. 16, 2007

(54) METHOD AND APPARATUS FOR PRODUCING PATH METRICS IN TRELLIS

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 602 days.

(21) Appl. No.: 10/348,124

(22) Filed: Jan. 20, 2003

(65) Prior Publication Data

US 2003/0154441 A1 Aug. 14, 2003

(30) Foreign Application Priority Data

Jan. 21, 2002 (FI) .................................. 20020108

(51) Int. Cl.
*H03M 13/03* (2006.01)
(52) U.S. Cl. ..................................... 714/792
(58) Field of Classification Search ................ 714/796, 714/791–795, 792; 375/262, 341
See application file for complete search history.

(56) References Cited

U.S. PATENT DOCUMENTS

| | | | | |
|---|---|---|---|---|
| 5,933,462 | A | 8/1999 | Viterbi et al. | 375/341 |
| 6,115,436 | A * | 9/2000 | Ramesh et al. | 375/341 |
| 6,163,581 | A * | 12/2000 | Kang | 375/341 |
| 6,452,979 | B1 | 9/2002 | Ariel et al. | 375/262 |
| 6,865,710 | B1 * | 3/2005 | Bickerstaff et al. | 714/796 |

FOREIGN PATENT DOCUMENTS

| | | |
|---|---|---|
| EP | 1 128 560 | 8/2001 |
| WO | WO 01/43293 | 6/2001 |
| WO | WO 02/07453 | 1/2002 |

OTHER PUBLICATIONS

Sep. 1995, H.Dawid and H. Meyr, "Real-Time Algorithms and VLSI Architectures for Soft Output Map Convolutional Decoding", 6th IEEE International Symposium on Personal, Indoor and Mobile Radio Communications, Toronto, Canada vol. 1, pp. 193-197.
S. Huettinger, M. Breiling, and J. Huber, "Memory Efficient Implementation of the BCJR Algorithm", 2nd International Symposium on Turbo codes and Related Topics, Brest, France.

* cited by examiner

*Primary Examiner*—Shelly Chase
(74) *Attorney, Agent, or Firm*—Hollingsworth & Funk, LLC

(57) ABSTRACT

The invention relates to a method and an apparatus for producing path metrics in a trellis. The trellis phase nodes that have the common nodes of the preceding trellis phase through the allowed state transitions determined by the code are defined as basic group nodes. Then path metrics corresponding to the code are produced, and in each basic group winner information on the winner path and path metric information on the rejected paths is stored in a memory in respect of only one node. Finally the signal is re-processed in the opposite direction trellis phase by trellis phase starting from the path metrics produced last by producing the path metrics of the preceding trellis phase basic group by basic group using the path metrics of the one node of the basic group of the present trellis phase and the winner information and path metric information stored in the memory.

39 Claims, 5 Drawing Sheets

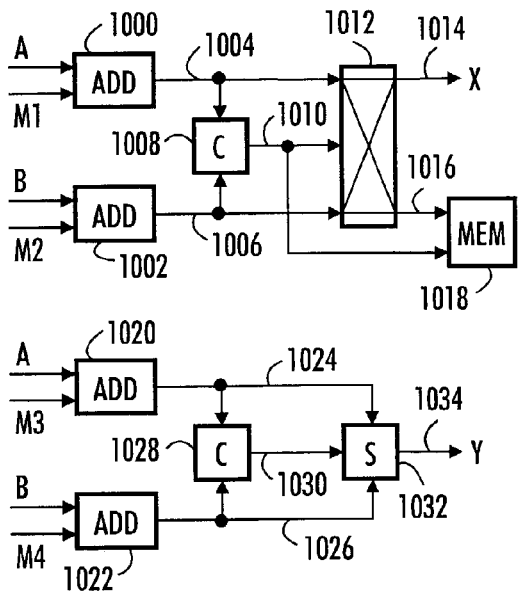
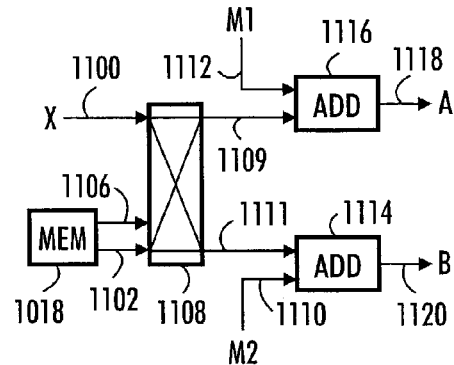
FIG. 10
FIG. 11
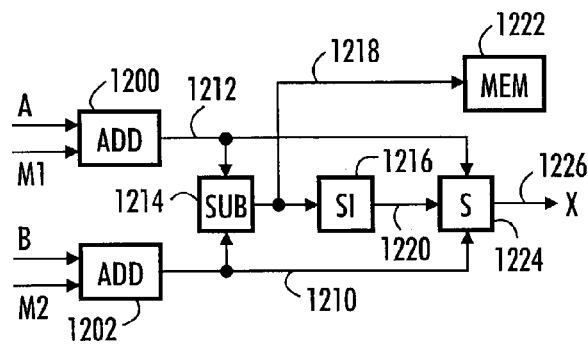
FIG. 12A
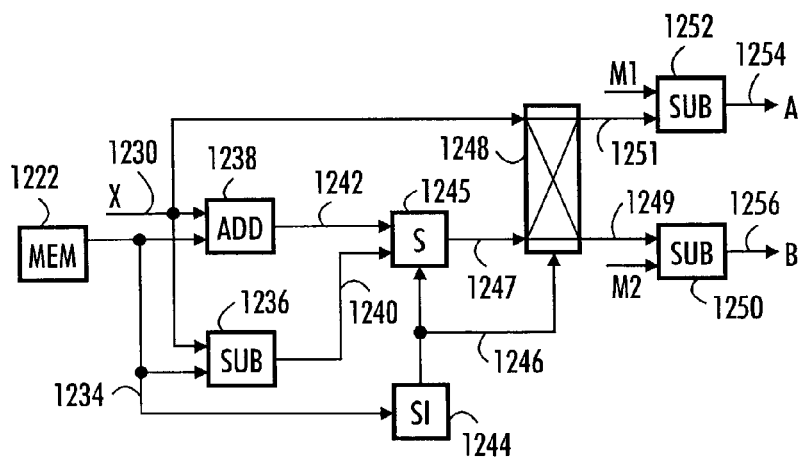
FIG. 12B

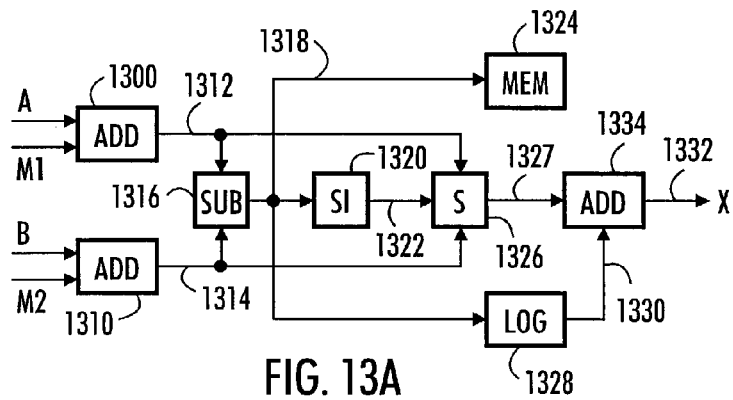
FIG. 13A
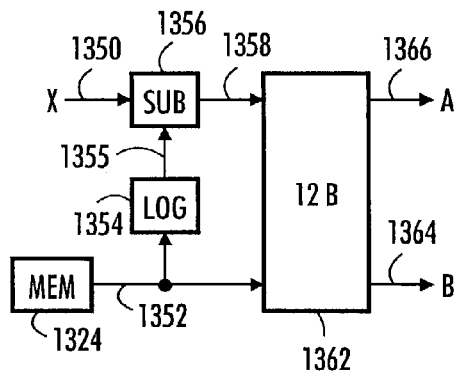
FIG. 13B
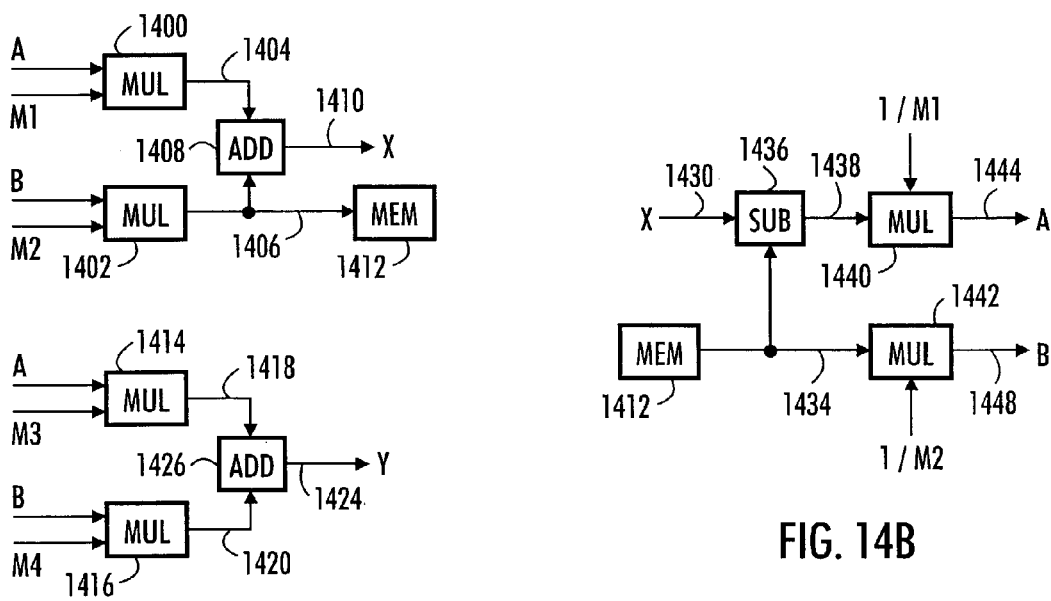
FIG. 14A
FIG. 14B

METHOD AND APPARATUS FOR PRODUCING PATH METRICS IN TRELLIS

FIELD

The invention relates to a method and an apparatus for producing path metrics in a trellis.

BACKGROUND

The channel used in telecommunications systems frequently causes interference in data transmission. Interference occurs in all kinds of systems but particularly in wireless telecommunications systems the transmission path attenuates and distorts the signal to be transmitted in various ways. On the transmission path interference is typically caused by multi-path propagation of the signal and different kinds of fading and reflection as well as by other signals transmitted on the same transmission path.

To reduce the influence of interference, different coding methods have been provided to protect signals from interference and to eliminate errors caused by interference in the signals. One frequently used encoding method is convolutional encoding. In convolutional encoding the signal to be transmitted and consisting of symbols is encoded into code words, which are based on the convolution of the symbols to be transmitted with themselves or with another signal. The convolutional code is defined by the coding ratio and coding polynomials. The coding ratio (k/n) means the number (n) of encoded symbols in relation to the number (k) of symbols to be encoded. The coder is usually implemented by means of shift registers. The constraint length K of the code refers to the degree of coding polynomials plus one. The coder may be regarded as a state machine with $2^{K-1}$ states.

One coding method developed from convolutional coding methods is parallel concatenated convolutional code, i.e. a turbo code. One way of forming a turbo code is to use two recursive and systematic convolutional encoders and interleavers. The resulting code includes a systematic part, which directly corresponds to symbols in the coder input, and two parity parts, which are the outputs of the parallel convolutional encoders.

A signal which has propagated on a channel is decoded in a receiver. The convolutional code can be both encoded and decoded using a trellis whose nodes (or equally states) correspond to the states of the encoder used in signal encoding and the paths between nodes belonging to two successive trellis phases of the trellis correspond to allowed state transitions between the encoder states. The code unequivocally attaches the initial and the final state of the transition, the bit under encoding and the bits of the encoding result to each state transition. The purpose of the decoder is thus to determined successive states of the coder, i.e. transitions from one state to another, which are caused by the original bits. To determine the transitions, metrics are calculated in the decoder. There are two kinds of metrics: path metrics (also state metrics) and branch metrics. The path metrics represents the probability at which the set of symbols included in the received signal leads to the state corresponding to the node in question. The branch metrics is proportional to the probabilities of transitions.

A Viterbi algorithm is usually used in decoding of a convolutional code. An example of a decoding method which requires more intensive calculation is a MAP (Maximum Aposteriori Probability) algorithm and its variations, e.g. Log MAP algorithm or Max Log MAP algorithm. The MAP algorithm is also known as a BCJR algorithm (Bahl, Cocke, Jelinik and Raviv) according to the persons who presented it first. Usually the MAP algorithm and its variations provide a considerably better result than the Viterbi algorithm. Furthermore, since the MAP algorithm and its variations are SISO algorithms (Soft Input Soft Output), they are particularly suited for iterative decoding, e.g. for decoding a turbo code where a posteriori probabilities can be utilized. The basic Viterbi algorithm is a Hard Output algorithm which has to be converted to obtain soft decisions, which increases its calculation complexity. Thus the algorithm obtained through conversion is not as good as MAP-based algorithms.

To estimate a posteriori probabilities, the MAP algorithm and its variations usually require path metrics for each bit to be decoded both from the beginning of the trellis to its end and from its end to its beginning at the bit in question. According to the prior art, the values of the path metrics of all nodes are stored in a memory in each trellis phase in respect of one direction, e.g. forwards, and then values are calculated for the other direction, e.g. backwards. The problem associated with this solution is that it requires a lot of memory because all path metrics of one direction are stored in the memory so as to allow their utilization with the path metrics to be calculated in the other direction.

U.S. Pat. No. 5,933,462, which is incorporated herein by reference, describes use of a sliding window to reduce the memory requirement. The solution comprises calculating and storing forward path metrics in respect of a window with a certain constant length and then reading them in inverse order with the backward path metrics for further measures. A solution based on the same principle is described in H. Dawid and H. Meyr: *Real-Time Algorithms* and *VLSI Architectures for Soft Output Map Convolutional Decoding in $6^{th}$ IEEE International Symposium on Personal, Indoor and Mobile Radio Communications*, Toronto, Canada, Volume 1, pp. 193–197, September 1995.

Another prior art solution is to use the Log MAP algorithm instead of the Max Log MAP algorithm to invert the original calculation direction of path metrics, which makes additional memory unnecessary. The solution is described in S. Huettinger, M. Breiling and J. Huber: *Memory Efficient Implementation of the BCJR Algorithm* in Proceedings of the $2^{nd}$ International Symposium on Turbo Codes and Related Topics, Brest, France, 4–7 Sep. 2000. The problem associated with this solution is that the path metrics calculated in the inverse direction are not accurate due to the solving method used but cause errors in the values of path metrics. Furthermore, implementation of the Log MAP algorithm is more complicated than that of the Max Log MAP algorithm although the capacity of the Log MAP algorithm is slightly better than that of the Max Log MAP algorithm.

To sum up, there is a great need to solve backward processing of a trellis opposite to the actual processing direction using the memory as efficiently as possible without impairing the quality of the result.

BRIEF DESCRIPTION

The object of the invention is to provide an improved method and apparatus for producing path metrics in a trellis, whose nodes describe encoder states of the code used in signal encoding, and the paths between the nodes belonging to successive trellis phases of the trellis describe allowed state transitions, to which the encoder unequivocally attaches the initial state, the final state, the bit to be encoded and bits of the encoding result.

The improved method comprises: defining the trellis phase nodes that have the common nodes of the preceding trellis phase through the allowed state transitions determined by the code as basic group nodes; processing the signal by producing, trellis phase by trellis phase, path metrics corresponding to the code, and storing in each basic group winner information on the winner path and path metric information on the rejected paths in a memory in respect of only one node; re-processing the signal in the opposite direction trellis phase by trellis phase starting from the path metrics produced last by producing the path metrics of the preceding trellis phase basic group by basic group using the path metrics of the one node of the basic group of the present trellis phase and the winner information and path metric information stored in the memory.

The improved apparatus comprises: means for defining the trellis phase nodes that have the common nodes of the preceding trellis phase through the allowed state transitions determined by the code as basic group nodes; means for processing the signal by producing, trellis phase by trellis phase, path metrics corresponding to the code, and storing in each basic group winner information on the winner path and path metric information on the rejected paths in a memory in respect of only one node; and means for re-processing the signal in the opposite direction trellis phase by trellis phase by producing the path metrics of the preceding trellis phase basic group by basic group starting from the path metrics produced last using the path metric of the one node of the basic group of the present trellis phase and the winner information and path metric information stored in the memory.

The improved apparatus is configured to: define the trellis phase nodes that have the common nodes of the preceding trellis phase through the allowed state transitions determined by the code as basic group nodes; process the signal by producing, trellis phase by trellis phase, path metrics corresponding to the code, and storing in each basic group winner information on the winner path and path metric information on the rejected paths in a memory in respect of only one node; and re-process the signal again in the opposite direction trellis phase by trellis phase starting from the path metrics produced last by producing the path metrics of the preceding trellis phase basic group by basic group using the path metric of the one node of the basic group of the present trellis phase and the winner information and path metric information stored in the memory.

The preferred embodiments of the invention are disclosed in the dependent claims.

The invention comprises dividing the nodes of a trellis phase into basic groups. A trellis phase can also be called a column of trellis. The trellis phase nodes that have common nodes of the preceding trellis phase through the allowed state transitions determined by the code are defined as basic group nodes. The basic group and the nodes of the preceding trellis phase related to it are called a butterfly chart because of the shape of the figure they form.

When the signal is processed according to the invention, the winner information on the winner path and path metric information on the rejected paths are stored in the memory in each basic group of each trellis phase in respect of only one node. The new path metrics of the basic group nodes are calculated in a prior art manner. When the signal is re-processed in the opposite direction starting from the path metrics produced last, the path metrics of the preceding trellis phase are produced for each basic group of the present trellis phase of the code applied using the present path metric of only one node of the basic group and the winner information and path metric information stored in the memory.

These measures enable error-free re-calculation of all path metrics of the preceding trellis phase of the basic group. The path metrics of all nodes of the preceding trellis phase can be calculated by processing each basic group of the present trellis phase.

The method and apparatus of the invention provide a considerable advantage: efficient memory use in the processing of the trellis without causing additional errors to the result. This advantage is significant in application of the MAP algorithm and its variations to turbo code decoding, in particular.

BRIEF DESCRIPTION OF THE FIGURES

The invention will now be described in greater detail by means of preferred embodiments with reference to the accompanying drawings, in which

FIGS. 10 and 11 are block diagrams illustrating a feasible structure for the apparatus for producing path metrics in the trellis;

FIGS. 12A and 12B are block diagrams illustrating a feasible structure for the apparatus for producing path metrics in the trellis;

FIGS. 13A and 13B are block diagrams illustrating a feasible structure for the apparatus for producing path metrics in the trellis; and FIGS. 14A and 14B are block diagrams illustrating a feasible structure for the apparatus for producing path metrics in the trellis.

DETAILED DESCRIPTION OF THE EMBODIMENTS

Figure 1:
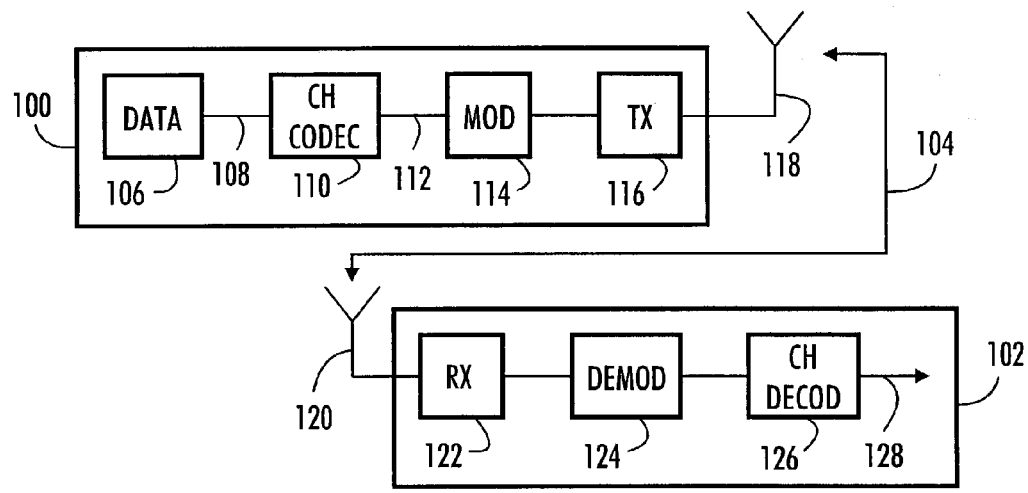
FIG. 1 is a simplified block diagram illustrating a transmitter and a receiver.

First we will describe, with reference to FIG. 1, an example of a transmitter 100 and a receiver 102 where the method and apparatus for producing path metrics in a trellis can be used. In the example of FIG. 1 the transmitter 100 and the receiver 102 communicate via a radio channel 104. The transmitter 100 comprises a data source 106, which may be a speech encoder or another conventional data source used in circuit-switched or packet-switched data transmission. A signal 108 to be transmitted is received from the output of the data source and supplied to a channel encoder 110, which in this case is a convolutional encoder, preferably a turbo encoder. The encoded symbols 112 are supplied to a modulator 114, where the signal is modulated in a prior art manner. The modulated signal is supplied to radio frequency parts 116, where it is amplified and transmitted to the radio path 104 by an antenna 118.

On the radio path 104 the signal is affected by interference and typically by noise, too. The receiver 102 comprises an antenna 120 for receiving the signal, which is supplied to a demodulator 124 via radio frequency parts 122. The demodulated signal is supplied to a channel decoder 126, where the signal is decoded using the methods of producing path metrics in a trellis to be described below. From the decoder the decoded signal 128 is supplied further to the other parts of the receiver 102.

Figure 2A:
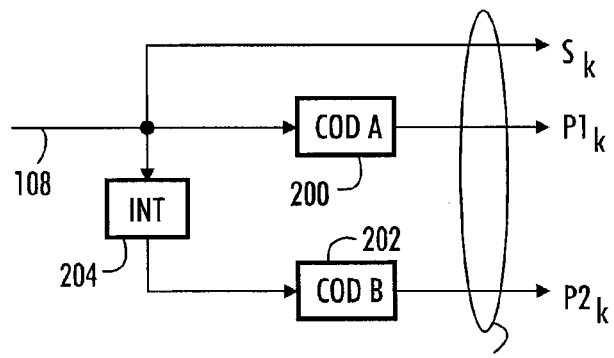
FIG. 2A is a simplified block diagram illustrating a turbo encoder.

FIG. 2A illustrates the structure of a typical turbo encoder, comprising two encoders 200, 202 and an interleaver 204. The signal to be encoded 108 is supplied as such to the output of the turbo encoder. This component is called the systematic part S of the code. The signal to be encoded is also supplied as such to the first encoder A 200 and the interleaver 204. The interleaved signal is supplied to the second encoder B 202. The output signal P1 of the first encoder 200 and the output signal P2 of the second encoder 202 are called parity parts of the code; P1 is the parity of ascending order and P2 is the parity of interleaved order. The ascending order means the address order in which the bits enter the encoder A 200. The interleaved order is the order in which the bits enter the encoder B 202. The encoders 200, 202 can be either similar or different, and they have a prior art structure. In practical embodiments it is advantageous if the initial and final states of the encoder are pre-determined. For this reason encoding usually starts in a certain state and ends in a pre-determined known state. In encoding this shift of the encoder to a pre-determined final state is called termination and the bits that are encoded during the shift are called termination bits, which are not actual data. The initial state often consists of zero bits only and the termination also shifts the encoder back to the zero state in the end. This is not, however, always necessary although it facilitates the function of the decoder.

Figure 2B:
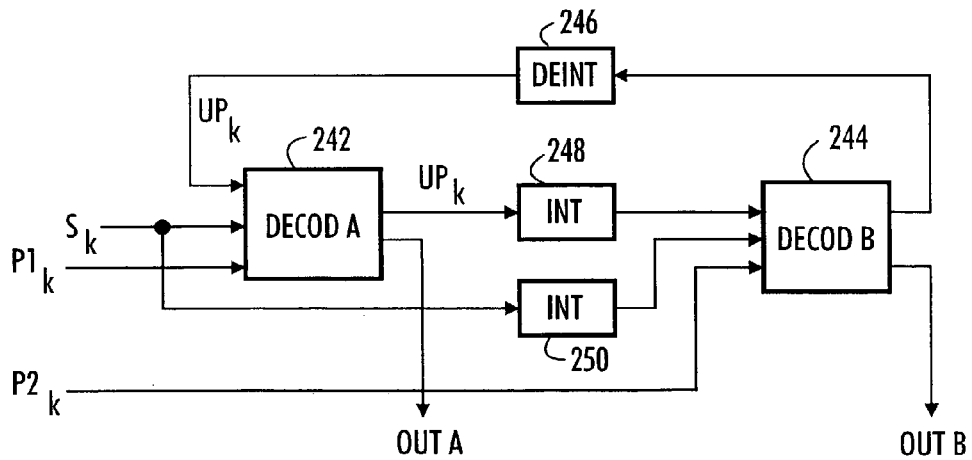
FIG. 2B is a simplified block diagram illustrating a turbo decoder.

FIG. 2B illustrates the general structure of a typical turbo decoder in the case of a 1/3 code. The input to the decoder consists of the systematic part $S_k$ of the code and parity parts $P1_k$ and $P2_k$. The decoder comprises two decoder units, a first unit A 242 and a second unit B 244. The input to the first unit 242 includes the systematic part $S_k$, the parity part $P1_k$ and the extrinsic weighting coefficient $UP_k$ of the code from the preceding iteration round. The weighting coefficient arrives from the output of the second unit B 244 via a deinterleaver 246. The output of the first unit 242 includes a new extrinsic weighting coefficient $UP_k$, which is supplied as input to the second unit 244 via an interleaver 248, and an output A which includes a soft decision and is supplied to the other parts of the receiver, if needed. The input to the second unit 244 also includes the systematic part $S_k$ of the code, which arrives via an interleaver 250, and the parity part $P2_k$. The output of the second unit 244 comprises the new extrinsic weighting coefficient $UP_k$, which is supplied to the first unit 242 via the deinterleaver 246, and an output B which includes a hard decision and is supplied to the other parts of the receiver, if needed.

In practice the interleavers 248 and 250 are often implemented using one interleaver. The decoders can also be arranged in parallel. In that case the decoder units 242, 244 are implemented by parallel decoders.

The trellis processing performed in connection with the MAP algorithm and its variations, e.g. Log MAP algorithm and Max Log MAP algorithm used in the decoder unit 242, 244 comprises three main steps: forward calculation of path metrics, backward calculation of path metrics and combination of the path metrics calculated forward and backward for calculation of a new extrinsic weighting coefficient and a soft and a hard decision. The new extrinsic weighting coefficient is supplied as an input parameter to the next iteration round whereas the hard bit decision is made on the basis of the sign of the soft decision. The branch metrics are typically proportional to the logarithm of the transition probabilities. Thus the sums of the metrics correspond to the products between the probabilities. Small metrics can thus correspond to a high probability.

Since the algorithms used in channel decoding are generally known to persons skilled in the art from textbooks, conference publications and the above-mentioned patent, for example, we will not discuss them any further here but will concentrate on the processing of the trellis.

TABLE 1

| Input bit | Present encoder state | Next encoder state | State transition | Parity bit |
|---|---|---|---|---|
| 0 | 000(0) | 000(0) | 0 ←→ 0 | 0 |
| 1 | 000(0) | 100(4) | 0 ←→ 4 | 1 |
| 0 | 001(1) | 100(4) | 1 ←→ 4 | 0 |
| 1 | 001(1) | 000(0) | 1 ←→ 0 | 1 |
| 0 | 010(2) | 101(5) | 2 ←→ 5 | 1 |
| 1 | 010(2) | 001(1) | 2 ←→ 1 | 0 |
| 0 | 011(3) | 001(1) | 3 ←→ 1 | 1 |
| 1 | 011(3) | 101(5) | 3 ←→ 5 | 0 |
| 0 | 100(4) | 010(2) | 4 ←→ 2 | 1 |
| 1 | 100(4) | 110(6) | 4 ←→ 6 | 0 |
| 0 | 101(5) | 110(6) | 5 ←→ 6 | 1 |
| 1 | 101(5) | 010(2) | 5 ←→ 2 | 0 |
| 0 | 110(6) | 111(7) | 6 ←→ 7 | 0 |
| 1 | 110(6) | 011(3) | 6 ←→ 3 | 1 |
| 0 | 111(7) | 011(3) | 7 ←→ 3 | 0 |
| 1 | 111(7) | 111(7) | 7 ←→ 7 | 1 |

It is known that a trellis whose nodes correspond to the encoder states is naturally related to each convolutional code. The nodes of two successive trellis phases are connected by paths, which are determined by the state transitions allowed by the convolutional code. The convolutional code attaches the initial and the final state, the bit to be encoded and the bits of the encoding result to each state transition. An eight-state systematic and recursive encoder for a convolutional code will be described next with reference to FIG. 8. An input bit, which is described in the first column of Table 1, enters the input 800 of the encoder. The present state of the encoder, i.e. the bits from each block 814, 816, 818 arranged one after another, is illustrated in the second column of Table 1. The third column in the table shows the next state of the encoder. The encoder has two outputs: a systematic bit exits from output 802 and a parity bit from output 804, which is illustrated in the fifth column of Table 1. Thus the coding result of one state transition of the encoder comprises two bits: a systematic bit and a parity bit. The encoder further comprises summing blocks 806, 808, 810 and 812 for implementing recursion.

Figure 8:
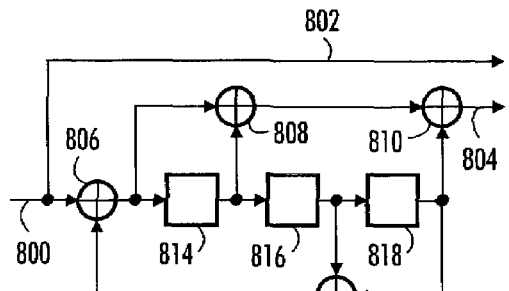
FIG. 8 illustrates an eight-state systematic and recursive convolutional code encoder.
Figure 9:
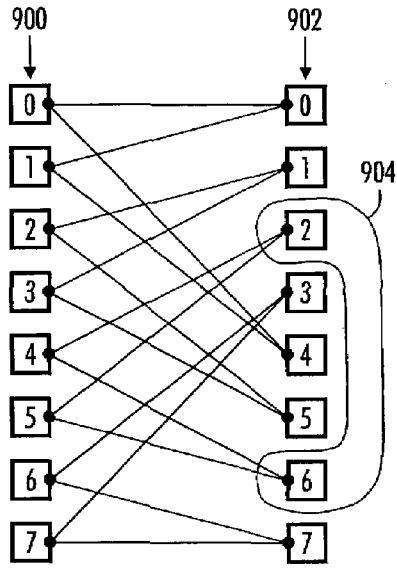
FIG. 9 illustrates two successive trellis phases of the trellis.

FIG. 9 illustrates two successive trellis phases 900, 902 of the trellis of the encoder shown in FIG. 8. The numbers in parentheses in the second and the third column of Table 1 refer to the trellis nodes denoted by numbers 0 to 7 in FIG. 9. Table 1 also shows state transitions of the encoder in the fourth column. Each state has two feasible states which are determined according to the input bit to be encoded at a given time. The trellis has one trellis phase more than is the number of bits to be encoded and possibly a few extra trellis phases thanks to the termination method used.

In the invention the trellis phase nodes are divided into basic groups. The trellis phase nodes that have common nodes of the preceding trellis phase through allowed state transitions determined by the code are defined as basic group nodes. The basic group and the related nodes of the preceding trellis phase are called a butterfly chart due to the pattern they form. In the case of the code used as an example there are four basic groups: {0,4}, {1,5}, {2,6} and {3,7}. In FIG. 9 basic group {2,6} is denoted by reference number 904. The butterfly chart of the basic group 904 is shown separately in FIG. 3. The butterfly chart consists of the nodes 300, 302 of the preceding trellis phase and of the nodes 304, 306 of the present trellis phase. The butterfly chart also includes the allowed state transitions 310, 312, 314, 316.

The calculation of path metrics and branch metrics and the connection between them are determined by the convolutional code and the decoder applied. In the butterfly chart of FIG. 3 the values X and Y of the new path metrics can be calculated e.g. as follows:

$$\begin{cases} X = \max(A + M1, B + M2) \\ Y = \max(A + M3, B + M4), \end{cases} \quad (1)$$

where A and B are the values of the path metrics from the preceding trellis phase and M1, M2, M3 and M4 are the corresponding values of the branch metrics between the nodes. The path metrics of all nodes of one trellis phase can be calculated by processing all basic groups.

The trellis is a tree chart where one branch can divide into two or more branches and correspondingly two or more branches can merge into one branch. Branching and merging take place in trellis nodes 300, 302, 304, 306. The path metric of node 300 is marked with letter A, that of node 302 with letter B, that of node 304 with letter X and that of node 306 with letter Y. Nodes 300 and 302 belong to the a certain first trellis phase of the trellis and nodes 304 and 306 belong to the second trellis phase following the first trellis phase. Allowed state transitions, i.e. transition paths, are shown between the nodes in FIG. 3, i.e. the transition paths are 310, 312, 314, 316. Let M1 be the numerical value the branch metric of path 310, M2 that of path 312, M3 that of path 314 and M4 that of path 316.

An ACS operation (Add-Compare-Select) is typically carried out in the nodes 300, 302 of the second trellis phase. 'Add' refers to adding the branch metrics of the allowed transition paths to the path metric of the first trellis phase. 'Compare' refers to the fact that in the nodes of the second trellis phase, the values of the path metrics of the paths that arrive in these nodes are compared with one another. 'Select' refers to the fact that in the node of the second trellis phase a path representing the best path metric value is selected as the path of the node in question, i.e. this path is the winner (or.survivor) path. The other paths are rejected. The trellis typically describes a binary-endoced signal, in which case there are two feasible paths 301, 312, 314, 316 from one node 300, 302 of the first trellis phase to the two nodes 304, 306 of the second trellis phase. One of the paths corresponds to the zero bit and the other to the one bit.

Figure 3:
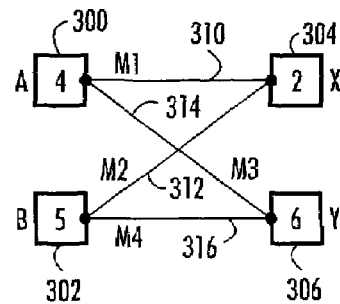
FIG. 3 illustrates part of a trellis.
Figure 4A:
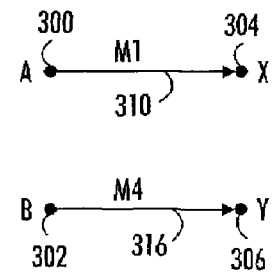
FIGS. 4A, 4B, 4C and 4D illustrate feasible combinations of winner paths in the part of the trellis shown in FIG. 3.
Figure 4B:
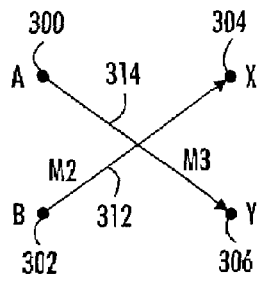
Figure 4C:
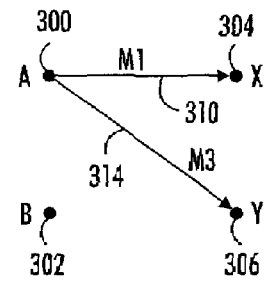
Figure 4D:
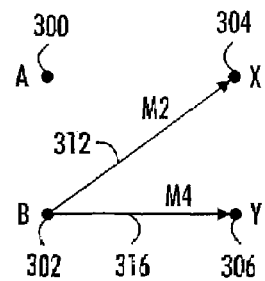

FIGS. 4A, 4B, 4C and 4D list all the possible ways in which the winner paths can be formed in the case of the example shown in the butterfly chart of FIG. 3. FIG. 4A illustrates a case where the winner path of node 304 is path 310 and its rejected path is path 312, and the winner path of node 306 is path 316 and its rejected path is path 314. In FIG. 4B the winner path of node 304 is path 312 and its rejected path is path 310, and the winner path of node 306 is path 314 and its rejected path is path 316. In FIG. 4C the winner path of node 304 is path 310 and its rejected path is path 312, and the winner path of node 306 is path 314 and its rejected path is path 316. In FIG. 4D the winner path of node 304 is path 312 and its rejected path is path 310, and the winner path of node 306 is path 316 and its rejected path is path 314.

In the trellis, movement forward and selection of winner paths occur as described in connection with FIGS. 3, 4A, 4B, 4C and 4D. The purpose of inverting the calculation described above is to determine all the path metrics of the original calculation direction along the trellis in reverse order. Unfortunately this is usually impossible. Assume that in the case of equation 1, for example, the value of all branch metrics M1, M2, M3 and M4 is 0 (zero), which is possible even in the case of a noise-free signal. Assume further that in the example of FIG. 4D A=100 and B=101, and thus X=101 and Y=101. When one moves backward in the trellis from the nodes of X and Y to the nodes of A and B, the original value of A cannot be calculated from the values of X, Y and branch metrics because it is impossible to conclude the original value 100 of A from numbers 101 and 0. However, the correct value of B can be determined.

Furthermore, examination of the combinations shown in FIGS. 4A, 4B, 4C and 4D reveals that in the case of 4A the path metrics of the preceding trellis phase can be calculated from the path metrics of the present trellis phase by subtracting the branch metric of the winner path from the present path metric value, i.e. A=X−M1, and correspondingly in the case of 4B A=Y−M3 and B=X−M2. The cases shown in FIGS. 4C and 4D are more problematic because in FIG. 4C B cannot be calculated at all and the same applies to A in FIG. 4D. This can be solved by retrieving the path metrics of the preceding trellis phase in respect of only one node of each basic group of the present trellis phase from the memory 518 in inverse order for the unit which calculates path metrics and uses the values so that in the case of FIG. 4C B is retrieved from the memory and in the case of FIG. 4D A is retrieved. Since recognition of the cases of FIGS. 4A and 4B requires extra work and the cases of FIGS. 4C and 4D require memory for the winner information and the metrics of the rejected paths, the case of FIG. 4A is calculated backwards in the same manner as the case of FIG. 4C and the case of FIG. 4B in the same manner as that of FIG. 4D. This means that in the example path metric Y is not needed as input information in processing in the inverse direction.

Figure 5:
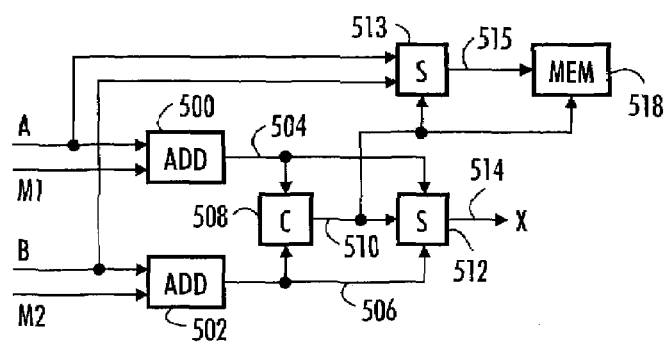
FIGS. 5 and 6 are block diagrams illustrating a feasible structure for the apparatus for producing path metrics in the trellis.
Figure 5:
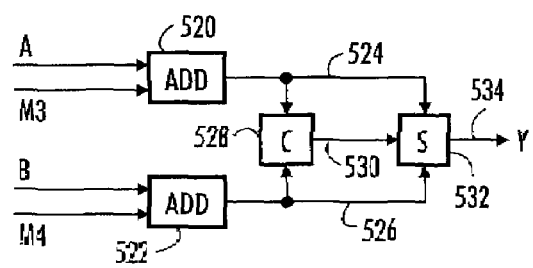
Figure 6:
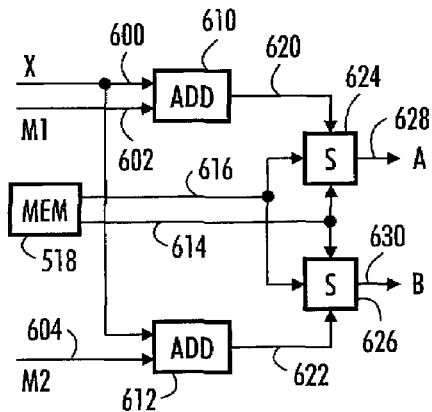

Next we will describe, with reference to FIGS. 5 and 6, one feasible structure of the apparatus for producing path metrics in a trellis where inverse calculation yields error-free values of the path metrics of the original calculation direction in inverse order. This apparatus can be employed for calculating the values of path metrics both forward and backward using the memory efficiently. The structure describes an apparatus for processing the path metric values corresponding to the butterfly chart illustrated in FIG. 3 both forward and backward in the trellis. In practice the processing shown in FIGS. 5 and 6 is performed on each basic group of the code applied trellis phase by trellis phase forward and backward along the trellis, and thus the function of the apparatus is in practice more complicated than what is described here, but a person skilled in the art can implement it without difficulty since the principles of the method become apparent from this description.

FIG. 5 describes the logical structure of the apparatus part that calculates path metrics in the first direction, i.e. forward in our example. This structure corresponds to one basic group (or butterfly chart), and the part processes the signal from the beginning to the end in our example by producing path metrics corresponding to the basic group from the signal. In the basic group winner information on at least one winner path and path metric information on the path metrics of the preceding trellis phase of the rejected paths are stored in the memory only in respect of one node. New path metrics of the basic group nodes are calculated in a prior art manner, using e.g. ACS units. The apparatus comprises four addition units 500, 502, 520, 522, to which the path metrics A, B and branch metrics M1, M2, M3 and M4 of the preceding trellis phase of the basic group are supplied as inputs. In each addition unit 500, 502, 520, 522 one path metric and one branch metric are added up. The calculation results 504, 506, 524, 526 are supplied in the manner described to two comparison units 508, 528 and two selection units 512, 532. Thus two numerical values are supplied to one comparison unit 508, 528, e.g. values A+M1 and B+M2 to the first comparison unit 508, and values A+M3 and B+M4 to the second comparison unit 528. The comparison unit 508, 528 selects which of the numerical values supplied to it, 504 or 506 and 524 or 526, is greater. If the numerical values are equal, i.e. A+M1=B+M2, the comparison unit 508, 528 selects only one of the values because the probability of a wrong choice is equally high regardless of which one of the values is selected.

From the comparison units 508, 528 the comparison result 510, 530 is supplied to two selection units 512, 532, where the selection information 510, 530 received as input is used for selecting which of the candidates for new path metrics 504, 506, 524, 526 received as input from the addition units 500, 502, 520, 522 is greater. The selection result 514, 534 is set as the value X and Y of the path metrics of the corresponding nodes. From the comparison unit 508 the selection information 510 is also supplied to the second selection unit 513, which selects the path metric from among the original path metrics A and B of the preceding trellis phase that corresponds to the new path metrics that was rejected in the selection unit 512. The value 515 of the path metric of the preceding trellis phase of the rejected path and the selection information 510, i.e. winner information on the winner path, are then supplied to the memory 518. In this example the node of path metric X has been selected as the node of the corresponding basic group in respect of which the winner information and the rejected path metric are stored in the memory. It is not necessary to perform corresponding additional measures on the node of path metric Y, and consequently only half of the path metrics of the trellis is stored in the memory. In the case of a binary encoded signal, for example, the size of the path metric memory is 50% smaller (if the one bit needed for the winner information is disregarded).

It will be obvious to a person skilled in the art that the structure illustrated in FIG. 5 mainly describes logical functionalities. It is to be understood that the comparison unit 508 and the selection unit 512 can be combined into one functional unit, into which the addition unit 500 can also be incorporated, if desired.

FIG. 6 describes the logical structure of the apparatus part that calculates path metrics in the direction opposite to the first direction, i.e. backwards in our example. This structure corresponds to one basic group (or butterfly chart) of the trellis phase and the part re-processes the signal in the opposite direction trellis phase by trellis phase from the end to the beginning in our example by producing path metrics of the preceding trellis phase basic group by basic group as follows: the path metric of at least one winner path of the preceding trellis phase is produced employing the present path metrics and the winner information stored in the memory, and the path metrics of the rejected paths of the preceding trellis phase are produced employing the winner information and path metric information stored in the memory.

In each trellis phase of the trellis, the apparatus receives as inputs, basic group by basic group, the present path metric 600 of one node, the branch metrics 602, 604 and the winner information 616 and the values 614 of the path metrics of the rejected paths from the memory 518. An adder 610, 612 subtracts the values 602, 604 of the branch metric corresponding to two allowed transitions from the present value 600 of the path metric, which yields numerical values 620, 622. The selection unit 624, 626 receives as inputs the value 620, 622 of the path metric calculated backwards and the winner information 616 and the values 614 of the metrics of the rejected paths from the memory 518. The selection unit 624 selects number 620 as the value 628 of path metric A of the preceding trellis phase if at X node the winner came from node A in the original direction; if the winner in the original direction came from node B, number 614 retrieved from the memory is selected as the value of A. The selection decision of the selection unit 626 is contrary to that of the selection unit 624: if the selection unit 624 selects the value retrieved from the memory, the selection unit 626 selects the calculated value 622 as the value 630 of path metric B. And vice versa: if the selection unit 624 selects the value 614 retrieved from the memory, the selection unit 626 selects the calculated value 622 as the new value 630 of path metric B.

Again it should be noted that the structure shown in FIG. 6 mainly illustrates logical functionalities. It is to be understood that, depending on the desired integration degree, the units 610, 612, 624, 626 shown in the figures can be combined into one or more functional entities.

Depending on the number of nodes of each trellis phase of the trellis being processed, as many of the functional entities shown in FIGS. 5 and 6 as are needed to process all basic groups can be chained one after another or in parallel. The functionality illustrated in FIGS. 5 and 6 is thus needed for each basic group in each trellis phase.

It was explained above how winner information and path metric information on the preceding state of the rejected paths are stored in the memory in respect of only one node. Also the following embodiment is feasible: the winner information and path metrics of the present phase of the rejected paths or their differences are stored in the memory in respect of only one node.

FIGS. 10 and 11 illustrate an embodiment where the metrics of the rejected paths are stored according to the present trellis phase of the trellis and not according to the preceding trellis phase as in FIGS. 5 and 6. In FIG. 10 the control information 1010 for the selection switch 1012 is received from a comparison unit 1008 and the path metrics to be controlled from addition units 1000 and 1002. The selection switch 1012 selects the value of the metric of the winner path as the value 1014 of node X. The selection information 1010 and the value 1016 of the metric of the rejected path are stored in the memory 1018. The path metric of node Y is calculated without additional procedures according to the prior art: branch metric M3, M4 is added to path metric A, B in an addition unit 1020, 1022. The candidate for path metric 1024, 1026 is supplied to the comparison unit 1028, which transmits comparison information 1030 to the selection unit 1032. The selection unit 1032 selects the better one of the path metrics 1024 and 1026 as the new path metric 1034.

FIG. 11 illustrates calculation of path metrics in inverse direction in accordance with FIG. 10. In each trellis phase the selection information 1106 and the value 1102 of the metric of the rejected path are retrieved from the memory 1018 and supplied to the selection switch 1108 together with the value 1100 of node X of the basic group of the present trellis phase. The selection switch 1108 is controlled with the selection information 1106 as follows: if the winner arrived in node X from node A, the path metric value 1100 is supplied to point 1109 and the metrics 1102 of the rejected path to point 1111. If the winner arrived in node X from node B, the metrics 1100 is supplied to point 1111 and the rejected metrics 1102 to point 1109. After this the addition unit 1116, 1114 subtracts the branch metric 1112, 1110 from the path metric 1109, 1111, which yields the path metric 1118, 1120 of node A, B. The value of node Y is not needed as input information in the inverse direction.

FIGS. 12A and 12B illustrate an embodiment where differences between the path metrics are stored in the memory in the present phase of the trellis. The sign of each difference functions as the selection information of the winner paths. A subtraction unit 1214 subtracts the metrics 1212 and 1210 of the allowed paths formed by addition units 1200, 1202 and arriving in the present node X of the trellis from each other: A+M1−(B+M2). The value 1218 of the difference is supplied to the memory 1222 and the sign unit 1216, from which the sign of the difference is supplied as input information 1220 to the selection unit 1224. If the sign is negative, the metric 1210 of the path from node B is selected as the path metric 1226 of node X, otherwise the metric 1212 of the path from node A.

FIG. 12B illustrates how the calculation direction of path metrics is inverted by the arrangement shown in FIG. 12A. The path metric 1230 of node X and the value 1234 of the difference to be retrieved from the memory 1222 are supplied to the addition unit 1238 and the subtraction unit 1236, of which 1238 adds up the information it has received as inputs and 1236 calculates their difference by subtracting the difference 1234 from the path metric 1230. The outputs of the addition unit 1238 and the subtraction unit 1236 are supplied to the selection unit 1245, which selects one of them on the basis of the control information 1246 received from the sign unit 1244. The sign unit 1244 receives the difference 1234 as input information from the memory 1222. The selection switch 1248 selects value 1230, 1247 as the path metric 1251, 1249 from among the path metrics 1247, 1230 on the basis of the sign information 1246 if the winner of node X arrived from node A; otherwise 1247, 1230 are selected as the path metric 1251, 1249. The subtraction unit 1252,1250 subtracts the value M1, M2 of the branch metric from the path metric 1251,1249 and node A, B receives 1254,1256 as the path metric.

One node from each basic group of the present trellis phase state can thus be selected as the node in respect of which the winner path and the rejected paths are defined. In the case of FIGS. 4A, 4B, 4C and 4D, for example, this means that node 304 is selected as such a node. Thus the winner information on the branch paths can be expressed with one bit: e.g. bit value 1 means that the node 300 of the preceding trellis phase was on the winner path and the node 302 of the preceding trellis phase was rejected in the selected node, in which case the path metric value of node 302 is stored in the memory 518 together with the bit in the case of FIGS. 4A and 4C. Correspondingly, bit value 0 would mean that node 302 of the preceding trellis phase was on the winner path and node 300 of the preceding trellis phase was rejected in node 304, in which case the path metric value of node 300 is stored in the memory 518 together with the bit in the case of FIGS. 4B and 4D. When reading the memory 518, one finds out the node whose path metrics can be retrieved from the memory by checking the bit value.

In an embodiment identification information is defined for the allowed state transitions of the selected node. In that case the winner information on the winner path of the selected node to be stored in the memory 518 can be identification information on the state transition.

The calculation method of path metrics illustrated in FIGS. 5, 6, 10, 11, 12A and 12B can be used in connection with the Max Log MAP algorithm, for instance.

In the following, an embodiment suitable for the Log MAP algorithm will be described. FIGS. 13A and 13B illustrate application of path metric calculation to Log MAP decoding.

It is known that if interference is modelled by additive white Gaussian noise, new path metrics in one butterfly chart shown in FIG. 3 can be calculated by formula $$\begin{cases} X = \log(e^{A+M1} + e^{B+M2}) \\ Y = \log(e^{A+M3} + e^{B+M4}) \end{cases} \quad (2)$$

This formula also lacks a generally inverse formula: if X and Y and the branch metrics M1, M2, M3 and M4 are known, the original values of A and B cannot be calculated. The simple reason for this is that if the branch metrics M1, M2, M3 and M4 are zeroes, which is possible even in the case of a noise-free signal, formula 2 gives the same numerical value both for X and for Y. In that case A and B cannot be solved from formula 2. Thus in the calculation of the path metrics of the Log MAP algorithm it is also necessary to store path metric information on one basic group to guarantee error-free inversion of the calculation direction.

As is known, formula 2 can also be written as follows:

$$\begin{cases} X = \log(e^{A+M1} + e^{B+M2}) = \\ \max(A+M1, B+M2) + \log(1+e^{-|\Delta|}) \\ Y = \log(e^{A+M3} + e^{B+M4}) = \\ \max(A+M3, B+M4) + \log(1+e^{-|A+M3-(B+M4)|}), \end{cases} \quad (3)$$

where difference $\Delta = A+M1-(B+M2)$. The log term on the right in formula 3 is usually implemented by a lookup table, which includes some pre-calculated values. The level of noise substantially affects the contents of the lookup table, even though this is not emphasized in formula 3. As the level of noise varies, the lookup table has to be updated. In front of the log term there may also be a coefficient which affects the magnitude of the term to be added, but the influence of the coefficient can be taken into account e.g. in the calculation of the lookup table. Value X of the path metric can be calculated by means of the right side of formula 3 using the winner/rejected path examination even though there are actually no winner paths and rejected paths in connection with the Log MAP. Instead, in the Log MAP the winner/rejected path examination is used to define how the information stored in the memory is to be used for the calculation of inverse path metrics.

FIG. 13A shows how the Log MAP algorithm proceeds in the original direction in the situation shown in the butterfly chart of FIG. 3 and stores information for later inversion of the calculation direction. An addition unit 1300, 1310 adds up path metric A, B and branch metric M1, M2 to numerical value 1312, 1314, which is supplied as input information to the subtraction unit 1316 and selection unit 1326. The subtraction unit 1316 calculates difference 1318, e.g. Δ=A+M1−(B+M2). The difference 1318 is supplied as input information to a memory 1324, a sign unit 1320 and a calculation unit 1328 for logarithm. The sign unit 1320 extracts the sign of the difference 1318 and transmits it to the selection unit 1326, which selects the greater one of the numerical values 1312 and 1314. The calculation unit 1328 for logarithm calculates or estimates the necessary log term value 1330 on the basis of the difference 1318 and transmits it to the addition unit 1334, which receives input information 1327 from the selection unit 1326. The addition unit 1334 adds values 1327 and 1330 up; the resulting numerical value 1332 is the new path metric value of node X. The path metric of node Y is calculated in a corresponding manner, except that the difference 1318 is not stored in the memory 1324 because at node Y memory information is not needed for the calculation in the inverse direction.

FIG. 13B illustrates how Log MAP calculation is carried out on one basic group in the opposite direction. Difference information 1352 of the trellis phase in question is retrieved from the memory 1324 and supplied to the calculation unit 1354 for logarithm. The path metric 1350 of node X and the output 1355 from the calculation unit 1354 for logarithm are supplied to the addition unit 1356, which subtracts numerical value 1355 from path metric 1350. Block 1362 includes the functionality illustrated in FIG. 12B; i.e. the output 1358 from the subtraction unit 1356 is connected to point 1230 in FIG. 12B and the difference 1352 to point 1234. Furthermore, points 1254, 1256 of FIG. 12B are connected to points 1366, 1364 of FIG. 13B. This way the values of path metrics A and B can be calculated in the opposite direction.

In the application of the invention to the MAP algorithm, the selection criterion for the winner path is not necessarily based on the use of a maximum or a minimum. The reason for this difference is that the original MAP algorithm calculates path metrics directly using probabilities instead of logarithms and all allowed transition paths affect the path metric value of the node. As a result of this, the MAP algorithm requires more complex calculations than the alternatives described above and thus it is used relatively seldom in practical embodiments. The MAP algorithm calculates the path metrics shown in the butterfly chart of FIG. 3 using formula $$\begin{cases} X = A*M1 + B*M2 \\ Y = A*M3 + B*M4, \end{cases} \quad (4)$$

where M1, M2, M3 and M4 are conditional probabilities of state transitions. Like the preceding formulae 1, 2 and 3, this formula is also generally irreversible: if the probabilities of state transitions are equal M1=M2=M3=M4=0.5 and A=4 and B=2, then X=Y=4*0,5+2*0,5=2+1=3. It is impossible to solve original values 2 and 4 of A and B from number 3 by means of equal state transition probabilities. In other words, path metric information has to be stored to avoid errors in the inversion of the calculation direction. It is sufficient for successful inversion of the calculation direction that the path metric information of one allowed path is stored in the memory in one node of the basic group. FIGS. 14A and 14B are examined as examples. FIG. 14A illustrates calculation of path metrics in the original calculation direction and path metric information to be stored in the memory in respect of one basic group. A multiplier unit 1400, 1402 multiplies the path metric of node A, B by branch metric M1, M2, after which the products 1404 and 1406 are added up by an addition unit 1408 to new path metrics 1410 of node X. The product 1406 from node B is always stored in the memory 1412. The path metric of node Y is calculated in a corresponding manner (reference numbers 1414 and 1416 denote multiplier units, reference number 1426 denotes the addition unit, reference numbers 1418 and 1420 denote products and reference number 1424 denotes the new path metric of node Y), except that nothing is included in the memory for calculation in the inverse direction. When the signal is processed in the opposite direction, the numerical values of path metric are calculated in each basic group trellis phase by trellis phase according to FIG. 14B. The subtraction unit 1436 subtracts the numerical value 1434 retrieved from the memory 1412 from the path metric value 1430 of node X. The multiplier unit 1440 multiplies the difference 1438 calculated by inverse 1/M1 of the corresponding branch metric, and the product 1444 is the path metric of node A. The multiplier unit 1442 correspondingly multiplies the numerical value 1434 by inverse 1/M2 of the branch metric, and the product 1448 is the original path metric of node B.

In node X the winner path can be selected e.g. on the basis of a maximum max(A*M1,B*M2) or it can be agreed that the winner always arrives along the transition path corresponding to the zero bit and correspondingly the rejected path arrives along the transition path of the one bit. If the code allows more than two state transitions per node, one and the same of them can be selected as the winner in each trellis phase. In the case of the MAP algorithm the winner/rejected path examination is not needed in the calculation of path metrics but to determine how the information stored in the memory is used for calculation in inverse order.

To sum up, the winner information is determined on the basis of only one node of the basic group of the present trellis phase and the path metric information for the inverse direction can be taken from the preceding or the present trellis phase, depending on the winner information.

Despite the fact that in FIGS. 3, 4A, 4B, 4C and 4D the trellis represents a binary-encoded signal, the various embodiments of the apparatus described in FIGS. 5, 6, 10, 11, 12A, 12B, 13A, 13B, 14A and 14B are used for MAP decoding, Log MAP decoding or Max Log MAP decoding, and the code generated in the encoder is preferably a turbo code, the examples are not limited to these cases but the method can be applied, in connection with decoding, to all forward and backward processing performed on the trellis which requires efficient memory processing. Thus the code generated in the encoder may be a systematic recursive convolutional code, usually a convolutional code, or any code or code part that can be presented by a trellis.

The decoder blocks shown in FIGS. 5, 6, 10, 11, 12A, 12B, 13A, 13B, 14A and 14B can be implemented as one or more application specific integrated circuits (ASIC). Implementations of other kinds are also feasible, e.g. a circuit built from separate logical components or a processor and its software. A combination of these implementations can also be used. In the selection of the implementation method a person skilled in the art will naturally consider the requirements set on the size and power consumption of the device, the necessary processing capacity, production costs and production volumes.

Figure 7:
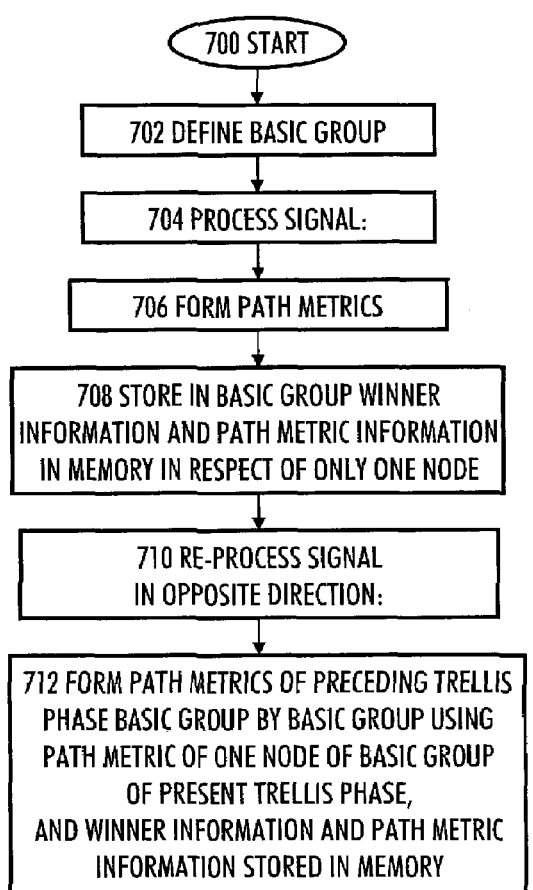
FIG. 7 is a flow chart illustrating a method of producing path metrics in the trellis.

In the following, a method of forming path metrics in a trellis will be described with reference to FIG. 7. The method starts in 700. Then in 702 the trellis phase nodes that have the common nodes of the preceding trellis phase through allowed state transitions determined by the code are defined as basic group nodes.

After this, the signal processing starts in the first direction, i.e. forwards or backwards, and the whole signal is processed trellis phase by trellis phase in 704. This is performed in 706 by producing the path metrics corresponding to the signal. Then in 708 winner information on the winner path and path metric information on the rejected paths are stored in the memory only in respect of one node in each basic group. Items 706 and 708 are repeated until the signal has been processed from the beginning to the end, i.e. all trellis phases and their basic groups have been processed.

Then the signal is processed in the direction opposite to the first direction, i.e. backward or forward, which means that in 710 the signal is re-processed in the opposite direction starting from the path metrics produced last. This is performed in 712 by producing the path metrics of the preceding trellis phase basic group by basic group using the path metric of one node of the basic group of the present trellis phase and the survivor information and path metric information stored in the memory. Item 712 is repeated until the signal has been processed from the end to the beginning. The method ends in. 714.

In an embodiment of the method the winner path is selected in the manner described above using a maximum or a minimum.

In an embodiment of the method the path of a pre-determined state transition is selected as the winner path.

In an embodiment of the method identification information is defined for each allowed state transition of the node. In that case the winner information to be stored in the memory may be identification information on the state transition.

In an embodiment of the method the path metric information to be stored in the memory comprises path metrics of the preceding trellis phase of the rejected paths.

In an embodiment of the method the path metric information to be stored in the memory comprises the difference between the path metrics of the preceding or the present trellis phase. In the latter case the difference between the path metrics can be calculated using the winner path and the rejected path. In that case the winner information may be a sign bit derived from the difference.

In an embodiment of the method the path metric information to be stored in the memory comprises the path metrics of the present trellis phase of the rejected path.

In an embodiment of the method the forming of path metrics is used for MAP decoding, Log MAP decoding or Max Log MAP decoding.

In an embodiment of the method the code generated in the encoder is a convolutional code, a systematic recursive convolutional code, a turbo code or another code or part of a code that can be presented by a trellis.

The devices described above are suitable for performing the method and its various embodiments, but devices of other kinds may also be suitable for implementing the method.

The method and apparatus described above can be used, for example, for decoding of a code included in a radio burst to be transmitted over the radio path in a radio system. If the radio burst comprises a signal with a certain length, the whole signal does not need to be processed in one go using the method described, but the signal can be processed in successive parts. Each part is processed by the method described in both directions to produce path metrics and then the next part is processed. The whole signal is thus processed by moving a processing window over the signal.

Even though the invention was described above with reference to the example according to the accompanying drawings, it is clear that the invention is not restricted thereto but may modified in various ways within the inventive concept disclosed in the appended claims.

The invention claimed is:

1. A method of producing path metrics in a trellis, whose nodes describe encoder states of a code used in signal encoding, and paths between the nodes belonging to successive trellis phases of the trellis describe allowed state transitions, to which the encoder unequivocally attaches an initial state, a final state, a bit to be encoded and bits of an encoding result, the method comprising:
   defining the trellis phase nodes that have common nodes of a preceding trellis phase through the allowed state transitions determined by the code as basic group nodes;
   processing a signal by producing, trellis phase by trellis phase, path metrics corresponding to the code, and storing winner information on a winner path and path metric information on rejected paths in a memory in respect of only one node in each basic group; and
   re-processing the signal in an opposite direction trellis phase by trellis phase starting from the path metrics produced last by producing the path metrics of the preceding trellis phase basic group by basic group using the path metrics of the one node of the basic group of the present trellis phase and the winner information and path metric information stored in the memory.

2. A method according to claim 1, further comprising selecting the winner path using a maximum or a minimum.

3. A method according to claim 1, further comprising selecting the path of a pre-determined state transition as the winner path.

4. A method according to claim 1, further comprising defining identification information on state transition for each allowed state transition of the node.

5. A method according to claim 4, wherein the survivor information to be stored in the memory is identification information on state transition.

6. A method according to claim 1, wherein the path metric information to be stored in the memory comprises the path metric of the preceding trellis phase of the rejected path.

7. A method according to claim 1, wherein the path metric information to be stored in the memory comprises the difference between the path metrics of the preceding trellis phase.

8. A method according to claim 1, wherein the path metric information to be stored in the memory comprises the difference between the path metrics of the present trellis phase.

9. A method according to claim 8, wherein the difference between the path metrics has been produced using the winner path and the rejected path.

10. A method according to claim 9, wherein the survivor information is a sign bit derived from the difference.

11. A method according to claim 1, wherein the path metric information to be stored in the memory comprises the path metrics of the present trellis phase of the rejected path.

12. A method according to claim 1, wherein production of path metric is used in connection with MAP decoding, Log MAP decoding or Max Log MAP decoding.

13. A method according to claim 1, wherein the code generated in the encoder is a convolutional code, a systematic recursive convolutional code, a turbo code or another code or part of a code that can be presented by a trellis.

14. An apparatus for forming path metrics in a trellis, whose nodes describe encoder states of a code used in signal encoding, and paths between the nodes belonging to successive trellis phases of the trellis describe allowed state transitions, to which the encoder unequivocally attaches an initial state, a final state, a bit to be encoded and bits of an encoding result, the apparatus comprising:

means for defining the trellis phase nodes that have common nodes of a preceding trellis phase through the allowed state transitions determined by the code as basic group nodes;

means for processing a signal by producing, trellis phase by trellis phase, path metrics corresponding to the code, and storing winner information on a winner path and path metric information on rejected paths in a memory in respect of only one node in each basic group; and means for re-processing the signal in an opposite direction trellis phase by trellis phase starting from the path metrics produced last by producing the path metrics of the preceding trellis phase basic group by basic group using the path metrics of the one node of the basic group of the present trellis phase and the winner information and path metric information stored in the memory.

15. An apparatus according to claim 14, wherein the winner path is selected using a maximum or a minimum.

16. An apparatus according to claim 14, wherein a path of a pre-determined state transition is selected as the winner path.

17. An apparatus according to claim 14, wherein identification information on state transition is defined for each allowed state transition of the node.

18. An apparatus according to claim 17, wherein the winner information to be stored in the memory is identification information on state transition.

19. An apparatus according to claim 14, wherein the path metric information to be stored in the memory comprises the path metrics of the preceding trellis phase of the rejected path.

20. An apparatus according to claim 14, wherein the path metric information to be stored in the memory comprises the difference between the path metrics of the preceding trellis phase.

21. An apparatus according to claim 14, wherein the path metric information to be stored in the memory comprises the difference between the path metrics of the present trellis phase.

22. An apparatus according to claim 21, wherein the difference between the path metrics has been produced using the winner path and the rejected path.

23. An apparatus according to claim 22, wherein the winner information is a sign bit derived from the difference.

24. An apparatus according to claim 14, wherein the path metric information to be stored in the memory comprises the path metric of the present trellis phase of the rejected path.

25. An apparatus according to claim 14, wherein production of path metric is used in connection with MAP decoding, Log MAP decoding or Log MaxMAP decoding.

26. An apparatus according to claim 14, wherein the code generated in the encoder is a convolutional code, a systematic recursive convolutional code, a turbo code or another code or part of a code that can be presented by a trellis.

27. An apparatus for producing path metrics in a trellis, whose nodes describe encoder states of a code used in signal encoding, and paths between the nodes belonging to successive trellis phases of the trellis describe allowed state transitions, to which the encoder unequivocally attaches an initial state, a final state, a bit to be encoded and bits of an encoding result, and the apparatus is configured to:

define the trellis phase nodes that have common nodes of a preceding trellis phase through the allowed state transitions determined by the code as basic group nodes;

process a signal by producing, trellis phase by trellis phase, path metrics corresponding to the code, and storing winner information on a winner path and path metric information on rejected paths in a memory in respect of only one node in each basic group; and re-process the signal in an opposite direction trellis phase by trellis phase starting from the path metrics produced last by producing the path metrics of the preceding trellis phase basic group by basic group using the path metrics of the one node of the basic group of the present trellis phase and the winner information and path metric information stored in the memory.

28. An apparatus according to claim 27, wherein the apparatus is configured to select the winner path using a maximum or a minimum.

29. An apparatus according to claim 27, wherein a path of a predetermined state transition is selected as the winner path.

30. An apparatus according to claim 27, wherein the apparatus is arranged to define identification information on state transition for each allowed state transition of the node.

31. An apparatus according to claim 30, wherein the winner information to be stored in the memory is identification information on state transition.

32. An apparatus according to claim 27, wherein the path metric information to be stored in the memory comprises the path metric of the preceding trellis phase of the rejected path.

33. An apparatus according to claim 27, wherein the path metric information to be stored in the memory comprises the difference between the path metrics of the preceding trellis phase.

34. An apparatus according to claim 27, wherein the path metric information to be stored in the memory comprises the difference between the path metrics of the present trellis phase.

35. An apparatus according to claim 34, wherein the difference between the path metrics has been produced using the winner path and the rejected path.

36. An apparatus according to claim 35, wherein the winner information is a sign bit derived from the difference.

37. An apparatus according to claim 27, wherein the path metric information to be stored in the memory comprises the path metrics of the present trellis phase of the rejected path.

38. An apparatus according to claim 27, wherein forming of path metric is used in connection with MAP decoding, Log MAP decoding or Log MaxMAP decoding.

39. An apparatus according to claim 27, wherein the apparatus is configured so that the code produced in the encoder is a convolutional code, a systematic recursive convolutional code, a turbo code or another code or part of a code that can be presented by a trellis.

* * * * *